United States Patent [19]

Muller

[11] Patent Number: 5,674,409
[45] Date of Patent: Oct. 7, 1997

[54] NANOLITHOGRAPHIC METHOD OF FORMING FINE LINES

[75] Inventor: K. Paul Ludwig Muller, Wappingers Falls, N.Y.

[73] Assignee: International Business Machines Corporation, Armonk, N.Y.

[21] Appl. No.: 407,518

[22] Filed: Mar. 16, 1995

[51] Int. Cl.$^6$ .................................................. H01L 21/027
[52] U.S. Cl. .................... 216/41; 156/643.1; 156/646.1; 156/659.11; 216/12; 216/49; 216/51; 216/58; 216/67; 216/74
[58] Field of Search ........................... 156/643.1, 646.1, 156/659.11; 216/58, 65–67, 72, 74, 79, 41, 49, 51, 12

[56] References Cited

U.S. PATENT DOCUMENTS

| | | | |
|---|---|---|---|
| 4,316,093 | 2/1982 | Broers et al. | 250/492.1 |
| 4,460,435 | 7/1984 | Maa | 156/643 |
| 4,550,257 | 10/1985 | Binnig et al. | 250/492.2 |
| 4,876,112 | 10/1989 | Kaito et al. | 427/38 |
| 5,057,187 | 10/1991 | Shinagawa et al. | 156/646.1 |
| 5,110,760 | 5/1992 | Hsu | 437/180 |
| 5,147,812 | 9/1992 | Gilbert et al. | 437/41 |
| 5,178,989 | 1/1993 | Heller et al. | 430/323 |

OTHER PUBLICATIONS

J. C. Carls, et al., "Deep Ultraviolet Photoresist Based on Tungsten Polyoxometalates and Poly(Vinyl Alcohol) for Bilayer Photolithography" J. Electrochem. Society, V. 139, No. 3, pp. 786–793, Mar., 1992.

Primary Examiner—T. Tung
Attorney, Agent, or Firm—Susan M. Murray

[57] ABSTRACT

A nanolithographic method for forming fine features is disclosed. A carrier layer, such as a photoresist, is deposited on a substrate. A relatively large pattern is imposed on the carrier layer by means of conventional photolithographic methods. The carrier layer is then exposed to a maskless etch, such as by ashing in oxygen, such that non-volatile materials within the carrier layer aggregate along the center line of the pattern, forming a residual pattern of significantly reduced width when compared to the original carrier layer pattern.

23 Claims, 2 Drawing Sheets

NANOLITHOGRAPHIC METHOD OF FORMING FINE LINES

FIELD OF THE INVENTION

This invention relates in general to the field of lithographic methods for forming semiconductor devices, and more particularly relates to a method of forming fine lines by nanolithography.

BACKGROUND OF THE INVENTION

As the scale of integration of semiconductor circuits increases, the ability to produce extremely fine features in a manufacturable way becomes increasingly important. Currently, a variety of well-known lithographic methods can be used to achieve a minimum feature size of 0.5 micrometers and smaller.

For example, U.S. Pat. No. 5,147,812 to Gilbert, entitled "Fabrication Method for a Sub-Micron Geometry Semiconductor Device", produces MESFETS having gate lengths of about 0.2–0.45 micrometers. A gate material is placed on a semiconductor wafer. Light sensitive material is deposited on the gate material. The light sensitive material is patterned using a chromeless mask modified in a predetermined area to phase shift light. Dark regions are projected on the light sensitive material by the destructive interference of the light passing through a non-modified portion of the mask and phase-shifted light passing through an adjacent modified portion of the mask. The exposed light sensitive material and gate material is removed to define the device gate and the remaining light sensitive material is removed.

U.S. Pat. No. 4,460,435 to Maa, entitled "Patterning of Submicrometer Metal Silicide Structures", discloses a complex method of forming metal silicide lines of 0.5 micrometer width over a step in an underlying substrate. Polysilicon is deposited on a substrate, followed by a deposition of a layer of refractory metal silicide. A patterned resist having a width substantially larger than the desired width of the finished line is then formed over the metal silicide layer. The exposed region of the silicide and polysilicon are then isotropically etched to the substrate. The remaining resist is redefined to reduce the line width to the desired size. A final anisotropic etch of the silicide and polysilicon produces a two-layer line of submicron width.

Several maskless methods for forming even finer features in the nanometer range have also been disclosed, but their use has been limited. For example, U.S. Pat. No. 4,316,093 to Broers, of common assignee, entitled "Sub-100A Range Line Width Pattern Fabrication", forms lines less than 100 Å wide. By adsorption from a vapor, a resist having a thickness less than that desired for the pattern to be formed is placed on a thin film resting on a substrate. An electron beam is directed towards the substrate. The resist moves towards the e-beam reaction zone by surface migration and is converted and fixed by the e-beam. The resist pattern is then used for further processing. U.S. Pat. No. 4,550,257 to Binnig, also of common assignee, entitled "Narrow Line Width Pattern Fabrication", uses a tunneling current to decompose gas molecules to provide a residue which with further processing can be converted into a line on the order of 8 Å wide. While both of these inventions form extremely fine lines, the cost and low throughput of the exposure equipment employed make their use cost-prohibitive.

Another method of producing features in the nanometer regime is proposed in U.S. Pat. No. 5,110,760 to Hsu, entitled "Method of Nanometer Lithography". A metallic layer is deposited on a substrate having one or more buttresses (protrusions). The metallic layer is then etched to remove the horizontal portion of the layer and to expose the buttresses. The substrate is then etched to remove the buttresses, leaving on the substrate vertical metal structures. This technique is disadvantageous because the geometry of the features formed is limited to perimetrical patterns due to the use of buttresses for defining the metal pattern.

What is needed is a cost-effective and high throughput method for forming fine features in the nanometer regime.

OBJECTS OF THE INVENTION

It is an object of the present invention to fabricate fine features.

It is an object of the present invention to fabricate fine features from residuals.

It is a further object of the present invention to fabricate residual features having a line width of approximately 50 nanometers.

It is a further object of the present invention to provide a high throughput method of fabricating residual features having a line width of approximately 50 nanometers.

SUMMARY

The invention is a nanolithographic method for forming fine lines. A carrier layer is deposited on a substrate. A relatively large pattern is imposed on the carrier layer using conventional lithographic methods. The carrier layer is then subjected to a maskless etch such that volatile products are removed and non-volatile materials within the carrier layer migrate towards the center of the carrier layer pattern forming a residual pattern of significantly reduced width when compared to the original carrier layer pattern. The residual pattern can then be used as is to form circuit sub-components or can be used as a mask to form circuit sub-components in an underlying layer.

BRIEF DESCRIPTION OF THE DRAWINGS

These and other features and advantages of the present invention are disclosed in, or apparent from, the following detailed description of preferred embodiments. The preferred embodiments are described with reference to the drawings, in which like elements are denoted with like numbers, and in which.

DETAILED DESCRIPTION OF THE INVENTION

Figure 1A:
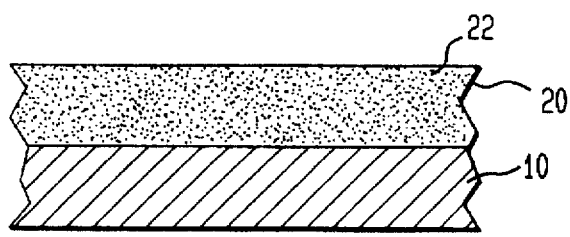
FIGS. 1A–1D are cross-section views of the resulting structure produced by the steps of a first embodiment of the method of the invention.
Figure 1B:
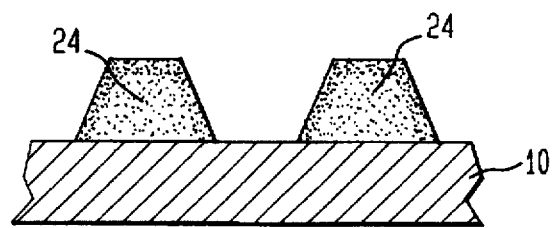

FIG. 1 is a cross-section view of the structures resulting from a first embodiment of the method of the present invention. With reference to FIG. 1A, a carrier layer 20 is deposited on substrate 10. The substrate may be a semiconductor wafer within which integrated circuits have been or will be placed, or may alternatively be a material, such as ceramic, on which completed integrated circuits may be mounted. Carrier layer 20 is preferably a photoresist, which can be of the DUV (deep ultra-violet), MUV (mid-UV), g-line or other type, but other materials may also be suitable. Carrier layer 20 is particularly characterized by the presence of non-volatile constituents 22 distributed substantially uniformly within a body of material that may be degraded into volatile products. Non-volatile constituents 22 may be impurities normally present in the body of material or may be deliberately introduced into the material. For example, if carrier layer 20 is a photoresist, a non-volatile constituent such as tungsten may be suspended in the polymer resist. Methods of incorporating tungsten and other metals within photoresists are disclosed in U.S. Pat. No. 5,178,989 to Heller et al. "Pattern Forming and Transferring Processes" which is incorporated herein by reference.

A commercially available DUV resist which lends itself to the method of the present invention is Apex-E photoresist available from the Shipley Company, LLC, Marlboro, Mass. Commercially available MUV resists include AZ 7500 available from Hoechst-Celanese and HPR204 available from OCG.

Carrier layer 20 may be deposited to a thickness of 1 micrometer in a variety of methods well-known in the art, preferably by spin coating. Other suitable methods include dipping, rolling and gas-phase deposition.

After deposition of carrier layer 20, the carrier layer 20 is patterned to form a carrier pattern 24. Carrier pattern 24 is a relief structure as shown by example in FIG. 1B. If the carrier layer 20 is a resist, conventional development methods can be used. If carrier layer 20 is an alternate material, conventional structuring methods, such as wet or dry etching, are also possible. The dimensions of the carrier pattern 24 are much larger than the patterns to be formed. For example, to form a line approximately 50 nanometers wide, the width of carrier pattern 24 from which the line is formed may be as large as 1.4 micrometer. The carrier layer 20 is patterned such that the carrier pattern 24 is centered over the desired locations of the residual patterns to be formed.

Next, the substrate 10 and carrier pattern 24 are exposed to a maskless etch so as to remove volatile products, leaving behind aggregated residual non-volatile constituents 22. As volatile products are progressively removed, a layer 25 is formed at the phase boundary 26 by the accumulation of non-volatile constituents 22. The layer 25 recedes with the phase boundary 26 in a manner similar to segregation as volatile products are carried away. Segregation occurs when the solubility of impurities differs across a phase boundary.

If the carrier layer 20 is a photoresist, the maskless etch is preferably done by ashing in an oxygen plasma. In this case, the volatile products $CO$, $CO_2$ and $H_2O$ are formed at the phase boundary 26 between the solid carrier pattern 24 and the gas phase. Ashing is preferably performed at an oxygen pressure of approximately 200 mTorr to 3 Torr, a volumetric flow of approximately 500–5000 standard cubic centimeters/minute and a micro-wave power of approximately 500 watts to 2 kilowatts for approximately 30 seconds to 2 minutes. Generally, higher oxygen pressures yield faster ashing rates, but usually at the cost of dimensional uniformity of the finished pattern. Higher powers have not been found to increase substantially the rate of ashing, but lower pressure may be employed for greater control over the stopping point.

Figure 1C:
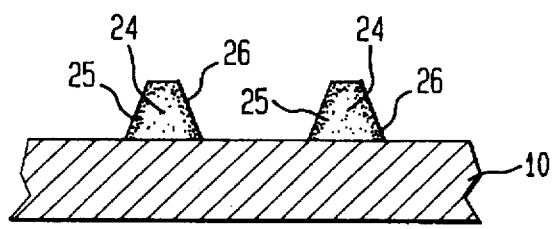
Figure 1D:
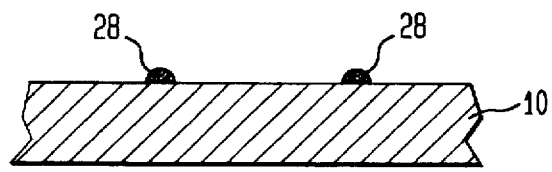

FIG. 1C shows the substrate 10 and carrier pattern 24 after the maskless etching step is partially performed. The dimensions of the carrier pattern 24 are much smaller as a result of the removal of volatile products. The non-volatile constituents 22 are no longer uniformly distributed throughout the cross-section of the carrier pattern, the non-volatile constituents nearest the phase boundary 26 having accumulated into a layer 25 of higher concentration near the phase boundary 26. FIG. 1D shows the result when the maskless etching is complete. The carrier pattern 24 has been removed, leaving only residual lines 28 formed from the aggregated non-volatile constituents 22.

Control of the concentration of non-volatile constituents 22 is desirable because the width of the residual lines 28 increases with higher concentrations of non-volatile constituents. If the concentration of non-volatile constituents is too low, the resulting residual lines 28 may be so minute that they are unsuitable for further processing. If the concentration of non-volatile products is too high, the layer 25 shown in FIG. 1C may form a shell which acts as an etch barrier, preventing removal of the volatile products in the interior of the carrier pattern 24. When the maskless etching is performed by a downstream asher in oxygen an approximate upper limit on the concentration on non-volatile constituents is 1% (atomic percent).

By incorporating metal, preferably aluminum or tungsten, into carrier layer 20 (preferably a resist) as non-volatile constituents 22 prior to deposition, the residual lines 28 can be used to make electrically conductive lines between selected circuits on the substrate. If the maskless etch is done by ashing in oxygen, it may be desirable to improve conductivity by removing surface oxides left on the residual lines 28. For aluminum lines, a short chromic-phosphoric acid dip is preferred. For tungsten lines, a hydrofluoric acid dip is preferred. Argon sputtering is also effective.

FIG. 2 is a cross-section of the structures resulting from a second embodiment of the method of the present invention. In FIG. 2 like reference numerals refer to similar or identical features as in FIG. 1. The second embodiment of the method of the invention is similar to the first embodiment, except that it involves an additional layer over which the residual lines are formed to act as a mask. With reference to FIGS. 2A=14 2B, sub-component layer 15 is deposited on substrate 10 prior to deposition of carrier layer 20. Sub-component layer 15 is any material in which it is desired to form a fine feature pattern which is resistant to the maskless etching technique to be employed. Polymer layers would generally be unsuitable. However, in light of the above disclosure, a person skilled in the art would observe the usefulness of depositing an insulator, such as an silicon dioxide, a metal or polysilicon as sub-component layer 15. Carrier layer 20 is the same as for FIG. 1.

Figure 2A:
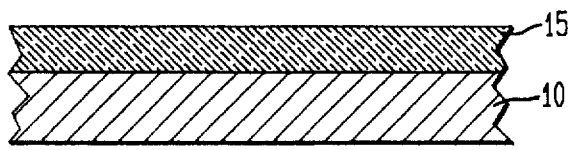
FIGS. 2A–2F are cross-section views of the resulting structure produced by the steps of a second embodiment of the method of the invention.
Figure 2B:
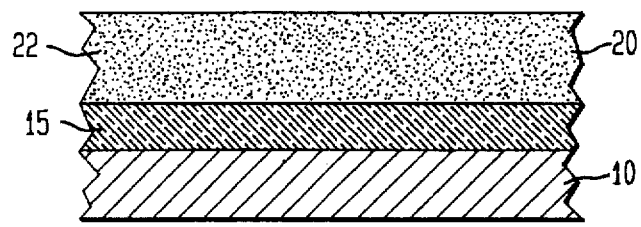
Figure 2C:
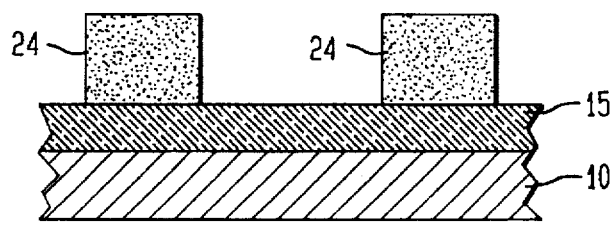
Figure 2D:
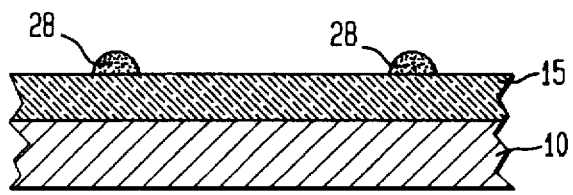
Figure 2E:
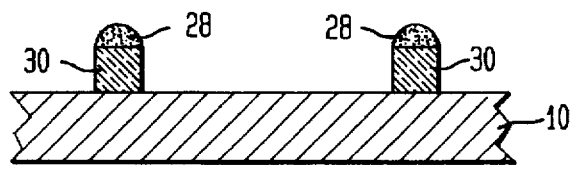
Figure 2F:
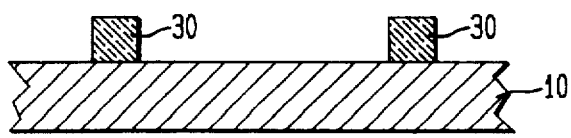

FIG. 2C shows the carrier pattern 24 formed after patterning carrier layer 20 according to the corresponding step of the method of the first embodiment of the present invention. FIG. 2D shows residual lines 28 after maskless etching is complete according to the corresponding step of the method of the first embodiment of the present invention. Note that layer 15 has not been eroded during the patterning of carrier layer 20 or the maskless etching step.

Next using residual lines 28 as a mask, sub-component layer 15 is patterned, preferably by anisotropic etching, more preferably by anisotropic dry etching, forming sub-components 30 capped with residual lines 28.

Finally, residual lines 28 can be removed by etching with solvents which selectively attack the non-volatile constituents used to form the residual lines 28, leaving sub-components 30. Suitable solvents for removing residual lines 28 may include EKC 837 and Posistrip 830, commercially available from EKC Technology Inc, of Hayward, Calif. and ST-80, ST-95 and SN-12, commercially available from ASCI, of Milpitas, Calif.

While FIGS. 1 and 2 show very simple patterns, the invention is not limited to any particular geometry. The original patterning may be as complex as state-of-the art patterning methods permit. If more complex patterns or closer spacings are desired, the method of the present invention can be iterated as necessary. More particularly, a first set of lines having a first line pattern determined by the patterning step is formed by performing the above-described steps. A second set of lines having a second line pattern determined by the patterning step can be made to overlay the first set of lines by repeating the above-described steps.

The following example is designed to illustrate certain aspects of the present invention. The example is not intended to be comprehensive of all features and embodiments of the present invention, and should not be construed as limiting the claims presented herein.

EXAMPLE 1

Apex-E photoresist, available from the Shipley Company, Marlboro, Mass. was spin coated on a silicon substrate to a thickness of 1 μm. The concentration of non-volatile constituents in the resist is estimated to be between approximately 0.1% and approximately 1% by volume. The resist was patterned by exposing portions of the sample to DUV radiation, and dissolving the exposed portions in tetramethylammonium hydroxide, resulting in features having a line width of 1.4 micrometers. Next the sample was ashed for approximately one minute in a downstream etcher with an oxygen flow of 5000 sccm/min at 2.7 Torr pressure, at 1 kWatt microwave power.

Additionally a nitrogen flow of 500 standard cubic centimeters/minute was also provided. The nitrogen has been found to improve the uniformity of the ashing. Upon completion of the ashing, all that remained of the resist were residual lines having a width of approximately 50 nm located on the centerline of the originally patterned features and formed of non-organic impurities within the resist.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of forming a residual pattern on a microelectronic substrate comprising the steps of:

obtaining a carrier layer on the microelectronic substrate;

patterning the carrier layer to form a carrier pattern centered on the location where the residual pattern is to be formed; and performing a maskless etch on the carrier pattern, whereby at least one non-volatile material within the carrier pattern aggregates at the center of the carrier pattern, forming the residual pattern.

2. The method of claim 1 wherein the carrier layer comprises photoresist.

3. The method of claim 2 wherein the photoresist is selected from the group consisting of: deep-ultraviolet photoresist, mid-ultraviolet photoresist and g-line photoresist.

4. The method of claim 1 wherein the step of performing a maskless etch comprises oxygen plasma ashing.

5. The method of claim 4 wherein the oxygen plasma ashing step is performed with an oxygen pressure of approximately 200 mTorr to 3 Torr at a flow rate of approximately 500 to 5000 standard cubic centimeters/minute and a micro-wave power of approximately 500 watts to 2 kilowatts.

6. The method of claim 1 wherein the at least one non-volatile material is a metal.

7. The method of claim 6 wherein the metal is of the group consisting of: aluminum, tungsten, molybdenum, niobium, vanadium, tantalum and combinations thereof.

8. The method of claim 7 wherein a further step is performed, the further step comprising removing surface oxides from the residual pattern.

9. The method of claim 8 wherein the at least one non-volatile material is aluminum and the step of removing surface oxides from the residual pattern comprises dipping the microelectronic substrate in chromic-phosphoric acid.

10. The method of claim 8 wherein the at least one non-volatile material is tungsten and the step of removing surface oxides from the residual pattern comprises dipping the microelectronic substrate in hydrofluoric acid.

11. A method of forming a residual pattern on a microelectronic substrate comprising the steps of:

obtaining a layer of photoresist on the microelectronic substrate, the photoresist having a predetermined concentration of at least one non-volatile constituent;

patterning the photoresist layer to form a resist pattern centered on the location where the residual pattern is to be formed; and performing a step of oxygen plasma ashing on the resist pattern whereby the at least one non-volatile constituent within the resist pattern aggregates at the center of the resist pattern, forming the residual pattern.

12. The method in claim 11 wherein the step of oxygen plasma ashing is performed with an oxygen pressure of approximately 200 mTorr to 3 Torr at a flow rate of approximately 500 to 5000 standard cubic centimeters/minute and a micro-wave power of approximately 500 watts to 1 kilowatt.

13. A method of forming semiconductor circuit sub-components on a microelectronic substrate comprising the steps of:

obtaining a sub-component layer on the microelectronic substrate;

obtaining a carrier layer on the sub-component layer;

patterning the carrier layer to form a carrier pattern centered on the location where a residual pattern is to be formed;

performing a maskless etch on the carrier pattern, whereby at least one non-volatile material within the carrier pattern aggregates at the center of the carrier pattern, forming a residual pattern;

patterning the sub-component layer using the residual pattern as a mask; and removing the residual pattern to form completed circuit sub-components.

14. The method of claim 13 wherein the sub-component layer material comprises a conductor.

15. The method of claim 13 wherein the sub-component layer material comprises an insulator.

16. The method of claim 15 wherein the sub-component layer is silicon dioxide.

17. The method of claim 13 wherein the carrier layer is a photoresist.

18. The method of claim 13 wherein the step of performing a maskless etch comprises oxygen plasma ashing.

19. The method of claim 18 wherein the oxygen plasma ashing step is performed with an oxygen pressure of approximately 200 mTorr to 3 Torr at a flow rate of approximately 500 to 5000 standard cubic centimeters/minute and a micro-wave power of approximately 500 watts to 2 kilowatts.

20. The method of claim 13 wherein the second patterning step comprises anisotropic dry etching.

21. The method of claim 13 wherein the residual pattern is removed by etching.

22. A method of forming semiconductor circuit sub-components on a microelectronic substrate comprising the steps of:

obtaining a sub-component layer on the microelectronic substrate;

obtaining a layer of photoresist on the sub-component layer;

patterning the carrier layer to form a carrier pattern centered on the location where a residual pattern is to be formed;

performing a step of oxygen plasma ashing on the resists pattern whereby at least one non-volatile material within the carrier pattern aggregates at the center of the carrier pattern, forming a residual pattern;

patterning the sub-component layer by anisotropic dry etching using the residual pattern as a mask; and removing the residual pattern by etching to form completed circuit sub-components.

23. The method of claim 22 wherein the step of oxygen plasma ashing is performed with an oxygen pressure of approximately 200 mTorr to 3 Torr at a flow rate of approximately 500 to 5000 standard cubic centimeters/minute and a micro-wave power of approximately 500 watts to 2 kilowatts.

* * * * *